United States Patent [19]
Chatigny et al.

[11] Patent Number: 5,153,859
[45] Date of Patent: Oct. 6, 1992

[54] LAMINATED PIEZOELECTRIC STRUCTURE AND PROCESS OF FORMING THE SAME

[75] Inventors: Joseph V. Chatigny, Wayne; Kumar Ogale, West Chester; Lewis F. Brown, Reading; Joseph F. Yaskowski, Worcester, all of Pa.

[73] Assignee: Atochem North America, Inc., Philadelphia, Pa.

[21] Appl. No.: 567,865

[22] Filed: Aug. 15, 1990

Related U.S. Application Data

[63] Continuation-in-part of Ser. No. 528,268, May 24, 1990, abandoned, which is a continuation of Ser. No. 438,974, Nov. 20, 1989, abandoned, which is a continuation of Ser. No. 331,336, Mar. 29, 1989, abandoned.

[51] Int. Cl.$^5$ .................................... H04R 17/00
[52] U.S. Cl. ........................... 367/140; 367/157; 367/160; 310/800; 310/330; 310/337; 29/25.35; 264/272.16; 264/204; 264/297.4; 264/DIG. 76
[58] Field of Search ............. 367/140, 157, 155, 160, 367/161; 310/800, 337, 330; 29/25.35; 264/DIG. 76, 332, 297.4, 272.16, 248, 204, 1.4

[56] References Cited

U.S. PATENT DOCUMENTS

| | | | |
|---|---|---|---|
| 3,779,854 | 12/1973 | Dukert et al. | 161/156 |
| 3,967,027 | 6/1976 | Igarashi et al. | 428/212 |
| 4,147,579 | 4/1979 | Schade | 29/25.35 |
| 4,156,800 | 5/1979 | Sear et al. | 310/800 |
| 4,166,229 | 8/1979 | DeReggi et al. | 310/337 |
| 4,310,957 | 1/1982 | Sachs | 29/25.35 |
| 4,330,730 | 5/1982 | Kurz et al. | 310/330 |
| 4,376,302 | 3/1983 | Miller | 367/157 |
| 4,378,510 | 3/1983 | Bennett | 310/329 |
| 4,405,402 | 9/1983 | Quilliam | 156/273.7 |
| 4,491,760 | 1/1985 | Lindvill | 310/334 |
| 4,517,665 | 5/1985 | DeReggi et al. | 367/163 |
| 4,521,322 | 6/1985 | Broussoux et al. | 310/800 |
| 4,539,554 | 9/1985 | Jarvis et al. | 345/365 |
| 4,555,953 | 12/1985 | Dario et al. | 73/862.04 |
| 4,578,442 | 3/1986 | Ohigashi et al. | 526/255 |
| 4,627,138 | 12/1986 | Im | 29/25.35 |
| 4,638,468 | 1/1987 | Francis | 367/153 |
| 4,692,285 | 9/1987 | Bloomfield et al. | 264/22 |
| 4,695,988 | 9/1987 | Barno | 367/154 |
| 4,734,228 | 3/1988 | Micheron et al. | 29/25.35 |
| 4,739,211 | 4/1988 | Strachan | 310/321 |

FOREIGN PATENT DOCUMENTS 0190574  8/1986  European Pat. Off. ............ 310/800

OTHER PUBLICATIONS

J. M. Powers, "Piezoelectric Polymer-An Emerging Hydrophone Technology," presented at EAS-CON-1979, Arlington, VA, Oct. 9-11, 1979, pp. 517-523.

A. Fiorillo et al., "Spinned P (VDF-TrFE) Copolymer Layer for a Silicon-Piezoelectric Integrated US Transducer", Proceedings of 1987 IEEE Ultrasonics Symposium held Oct. 14-16, 1987, proceedings published Nov. 30, 1987, pp. 667-670.

R. Swartz et al., "One the Generation of High-Frequency Acoustic Energy with Polyvinylidene Fluoride", IEEE Transactions on Sonics and Ultrasonics, vol. SU-27, No. 6, Nov. 1980, pp. 295-302.

Primary Examiner—J. Woodrow Eldred
Attorney, Agent, or Firm—Stanley A. Marcus

[57] ABSTRACT

A method of forming a laminated piezoelectric structure is disclosed wherein a plurality of polarized piezoelectric films of vinylidene fluoride and trifluoroethylene are solvent welded together. The solvent welding solution comprises a copolymer of vinylidene fluoride and trifluoroethylene and a suitable solvent. The transducers produced from such a laminated structure are also disclosed.

85 Claims, 7 Drawing Sheets

_Fig. 17a_

_Fig. 17b_

_Fig. 17c_

_Fig. 18_

LAMINATED PIEZOELECTRIC STRUCTURE AND PROCESS OF FORMING THE SAME

This application is a continuation-in-part of application Ser. No. 07/528,268, filed May 24, 1990, now abandoned, which is a continuation of application Ser. No. 07/438,974, filed Nov. 20, 1989, now abandoned, which is a continuation of application Ser. No. 07/331,336, filed Mar. 29, 1989, now abandoned.

BACKGROUND OF THE INVENTION

The present invention relates to a process of forming a laminated piezoelectric structure, and to piezoelectric transducers, particularly hydrophones, employing the laminate.

Piezoelectric polymer films of polyvinylidene fluoride (PVDF) have been used as sensing materials in a variety of applications. These films also possess pyroelectric activity. The principal crystalline forms of PVDF are the highly polar beta form and the non-polar alpha form. High piezoelectric and pyroelectric activities are associated with the polar beta form. In order to increase both the piezoelectric and pyroelectric activities of PVDF, the film is mechanically oriented and subjected to an intense electrical field, otherwise known as poling, to cause the oriented beta form crystallites to predominate.

Piezoelectric polyvinylidene fluoride film is a particularly useful sensing material for hydrophone applications because its acoustic impedance is close to that of water, and it possesses a hydrostatic stress constant ($g_h$) which is greater than that of conventional ceramic piezoelectric materials, such as barium titanate or lead zirconate titanate (PZT). It is also generally known that the sensitivity of such films for acoustic applications generally increases with the thickness of the piezoelectric film. Unfortunately, the poling step places a limit on the maximum thickness of fully polarized polyvinylidene fluoride films.

R. M. Quilliam in U.S. Pat. No. 4,405,401 issued Sep. 20, 1983 discloses that instead of using of a single thick polymeric piezoelectric film, a piezoelectric/pyroelectric element can be formed from a plurality of thin piezoelectric films. A laminated stack is formed by first individually coating the mechanically oriented, unpolarized PVDF films with a nitrile rubber-based adhesive. The adhesive is allowed to dry, and the films are assembled into a stack between two plates of a press. The platens of the press are heated and pressure is applied to reactivate the glue to form a bonded stack. A voltage is then applied across the heated stack to polarize the PVDF films. Quilliam also discloses that two or more of the polarized stacks may be assembled together with an inner electrode positioned between adjacent polarized stacks.

The glued laminated structure of Quilliam provides for piezoelectric elements with greater sensitivity than single layer devices. However, the dissimilar glue layer forms an interface with the piezoelectric film where some of the acoustic waves are reflected. This results in a decrease in the acoustic sensitivity of the device. The present invention overcomes this problem by laminating the piezoelectric layers so that the interface of dissimilar materials is eliminated.

SUMMARY OF THE INVENTION

The process of the present invention for forming the laminated piezoelectric structure comprises the steps of first providing a plurality of polarized piezoelectric films comprising a copolymer of vinylidene fluoride and trifluoroethylene. A solution comprising a copolymer of vinylidene fluoride and trifluoroethylene and a suitable solvent is interposed between the piezoelectric films. The solvent of the solution is then evaporated to thereby laminate the piezoelectric films.

The present invention also includes a piezoelectric transducer containing a plurality of stacked, laminated polarized piezoelectric films. The films comprising a copolymer of vinylidene fluoride and trifluoroethylene are laminated together with a solution of a copolymer of vinylidene fluoride and trifluoroethylene and a suitable solvent. Electrodes are then sandwiched around the laminated stack of films.

The process of the present invention also includes forming a plurality of laminated piezoelectric layers on an electroconductive conduit or a semiconductor substrate. The transducers produced by such a process are also within the scope of the present invention.

The solution which is used to laminate the piezoelectric films of the present invention solvent welds the two adjacent layers together to form a tightly bonded structure. After the solvent of the solution is evaporated, a thin layer of the copolymer of vinylidene fluoride and trifluoroethylene remains between the two adjacent piezoelectric films. Since the piezoelectric films are themselves fabricated from the same copolymer, there is no acoustic mismatch with this solution deposited layer.

BRIEF DESCRIPTION OF THE DRAWINGS

FIGS. 6a through 10b are cross sectional views of the process of the present invention for forming a laminated piezoelectric transducer on a semiconductor substrate.

DETAILED DESCRIPTION OF THE PREFERRED EMBODIMENTS

The piezoelectric films of the present invention are prepared from a copolymer of about 60 to about 95, preferably from about 70 to about 85, mole percent vinylidene fluoride ($VF_2$) and from about 5 to about 40, preferably from about 15 to about 30, mole percent trifluoroethylene ($VF_3$). Polarized piezoelectric films of such $VF_2$-$VF_3$ copolymers are prepared using conventional techniques, such as those disclosed by H. Ohigashi et al. in U.S. Pat. No. 4,578,442 and P. Bloomfield in U.S. Pat. No. 4,692,285, both of which are hereby incorporated by reference. Briefly, the polarized piezoelectric films are formed by first preparing the copolymer resin by conventional suspension or emulsion polymerization techniques. Films of the copolymer are then formed by solvent casting, melt extrusion, injection molding, pressing, calendaring, or other conventional film forming techniques.

After the films of the copolymer are formed, they are generally heated to a temperature below the Curie temperature of the resin. While in the heated state, the films are polarized by applying a direct current or ionic electrical field across the thickness of the film. This poling process provides for a permanent orientation of the molecular dipoles within the polymer film. The poling direction of the polarized piezoelectric film in the figures is depicted by the arrow. It is not necessary to mechanically orient a $VF_2$-$VF_3$ copolymer piezoelectric film because it is predominately in the beta phase form.

Polarized piezoelectric films of a homopolymer of vinylidene fluoride are not suitable for use in the present invention. As previously mentioned, PVDF films are mechanically oriented by stretching the PVDF film at an elevated temperature to cause the beta form crystallites to predominate. If the solution of the present invention which was used for laminating a mechanically oriented film, the film would wrinkle, due to the relaxation of the oriented polymer chains, and be unsuitable for forming a laminated piezoelectric structure. Furthermore, the solvents which are used with PVDF generally have a higher boiling point than those solvents which are used with the $VF_2$-$VF_3$ copolymers. Thus, it is more difficult to evaporate the solvents for PVDF without degrading the piezoelectric activity of the film.

The solvent welding solution which is used in the present invention contains from about 20 to about 40, preferably from about 20 to about 25, weight percent of the copolymer of vinylidene fluoride and trifluoroethylene dissolved in a solvent. The $VF_2$-$VF_3$ copolymer used in this solution is unpolarized. Suitable solvents for use in the solution include acetone, methyl ethyl ketone and ethyl acetate. Other polar solvents which dissolve $VF_2$-$VF_3$ may also be used. Solvents having low boiling points, such as acetone and methyl ethyl ketone, are preferred. The solution is prepared by heating the solvent, such as methyl ethyl ketone, to a temperature of about 60° C. and then adding the powdered copolymer while mixing.

If it is necessary to increase the capacitance of the stacked piezoelectric transducer to match the output processing circuitry, finely divided electroconductive particles may be added to the solvent welding solution which is used to bond selected pairs of the polarized piezoelectric films. After the solvent is evaporated, the remaining copolymer and electroconductive particles form an electroconductive layer to which external connections may be made. Preferred electroconductive particles are silver flake, but other electroconductive particles, such as carbon, copper, nickel and other metallic flakes, having a diameter between about 1 to about 3 microns may also be employed. This solution contains about 9 to about 24, preferably about 12 to about 16, weight percent of the copolymer of vinylidene fluoride and trifluoroethylene, about 12 to about 28, preferably about 18 to about 24, weight percent of the silver flake, and about 60 to about 70 weight percent of the solvent. Electrically conducting polymers, such as polyacetylene and polyvinyl carbazole, may also be employed as the electroconductive particles.

Figure 1A:
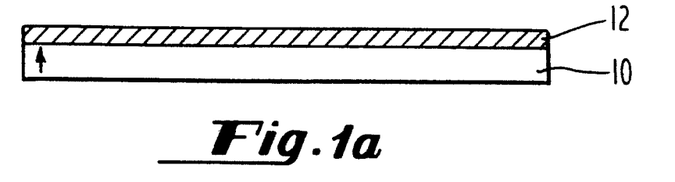
FIGS. 1a through 1e are cross sectional views illustrating the process of the present invention for forming a laminated piezoelectric transducer.

Referring now to FIGS. 1a through 1e, the process of forming the laminated piezoelectric structure will be described. As shown in FIG. 1a, the process begins with a first polarized piezoelectric film 10 comprising the copolymer of vinylidene fluoride and trifluoroethylene. This film, as well as the other polarized piezoelectric films used in the assembly, has a thickness of at least about 100 microns. The surfaces of the polarized piezoelectric films are typically prepared for laminating by first cleaning with an alcohol, such as isopropanol. The surfaces are then roughened using conventional techniques, such as plasma etching or sand blasting.

A first layer 12 of the solvent welding solution comprising the copolymer of vinylidene fluoride an trifluoroethylene and the solvent is applied to a major face of the first polarized piezoelectric film 10. This solution may be applied by spraying, brushing, or spreading with a doctor blade or roller to a thickness between about 0.25 and about 3 mils. Preferably, the solution has a thickness of about 1 mil.

Figure 1B:
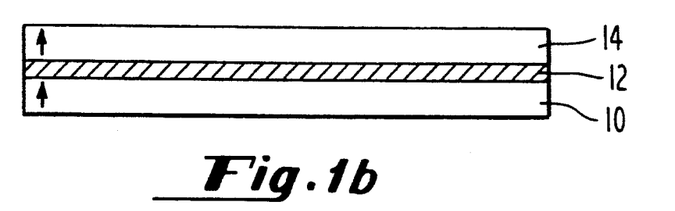

As shown in FIG. 1b, a second polarized piezoelectric film 14 is applied to the solution layer 12. The solvent from the solution layer 12 may be allowed to air dry to laminate the films 10 and 14. Preferably, however, the assembly is placed in the press with platens heated to a temperature between about 50° to about 60° C. A pressure of about 3000 psi is applied to the assembly during the heating step. During this process, the solvent from the solution softens the surfaces of the piezoelectric films 10 and 14 adjacent the solution area. When the solvent completely evaporates, layers 10 and 14 become solvent welded with a thin layer of the copolymer from the solution disposed therebetween. As shown in FIG. 1b, the second piezoelectric film 14 is applied such that its poling direction is in substantially the same direction as the first piezoelectric film 10 to form a series arrangement. This process may also be used to form a structure where the poling directions of the films are in substantially opposed directions to form a parallel arrangement, where, for example, there is an inner conductive layer.

Figure 1C:
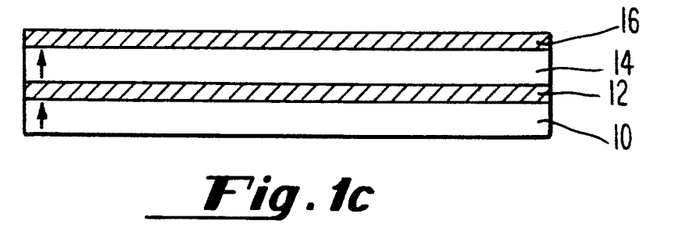
Figure 1D:
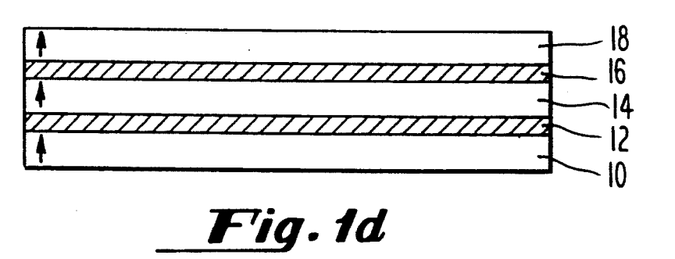

Referring now to FIG. 1c, an additional solution layer 16 comprising the copolymer of vinylidene fluoride and trifluoroethylene is applied to the second piezoelectric film 14. Then, as shown in FIG. 1d, a third polarized piezoelectric film 18 is applied over the solution wetted surface of the second piezoelectric film 14. Again, the solution is allowed to air dry or the assembly is inserted in a heated press. Additional solution and polarized piezoelectric film layers may be applied to produce a stacked assembly to virtually any thickness.

Alternatively, a single solution drying step may be carried out after all of the solution and polarized piezoelectric film layers have been assembled.

Although the above-described process (FIGS. 1c and 1d) shows the solvent welding solution being applied to the exposed surface of the second piezoelectric film 14, the solution can be alternatively applied to a surface of the third piezoelectric film 18.

Figure 1E:
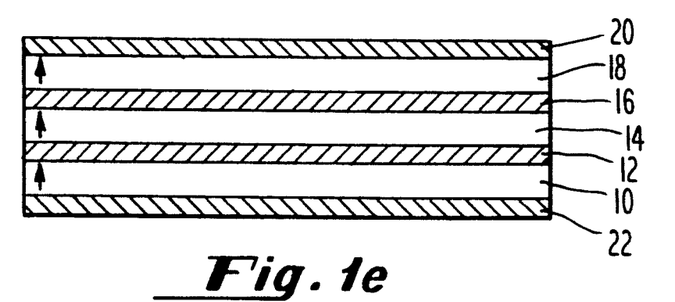

Turning now to FIG. 1e, after the desired number of piezoelectric layers have been laminated together, electrodes 20 and 22 are applied to the exposed major surfaces of the outermost piezoelectric films 10 and 18. The electrodes may be formed by vacuum evaporating or sputtering metals, such as silver, nickel, aluminum, gold or alloys thereof, onto the exposed surfaces of the piezoelectric films 10 and 18. These coated electrodes generally have thicknesses ranging between about 500 and about 3000 Angstroms.

The electrodes 20 and 22 may also be formed by laminating electroconductive films, such as aluminum, nickel or steel, to the exposed major surfaces of the piezoelectric layers 10 and 18. This technique is generally used when forming a hydrophone tile because the laminated electrodes stiffen the tile to enhance thickness mode sensitivity. An electroconductive aluminum-silicon carbide composite film having a thickness of about 0.005 inch can also be used as the electrodes. This composite contains 75 wt. percent aluminum and 25 wt. percent silicon carbide and is commercially available from Advance Composite Materials, Greensboro, S.C. The composite also stiffens the tile, but it is lighter than the nickel or steel films. This composite material or other electroconductive films may then be applied to the exposed surfaces of the assembly with a very thin elastomeric polyurethane adhesive, such as Tycel (TM) available from Lord Corporation. Although this adhesive is nonconductive, it is applied at thicknesses on the order of about 0.01 inch to allow for sufficient surface contact and electrical conduction between the electroconductive layer and the exposed surface of the piezoelectric films 10 and 18. Electrically conductive adhesives, such as conductive epoxy, may also be employed.

Figure 2:
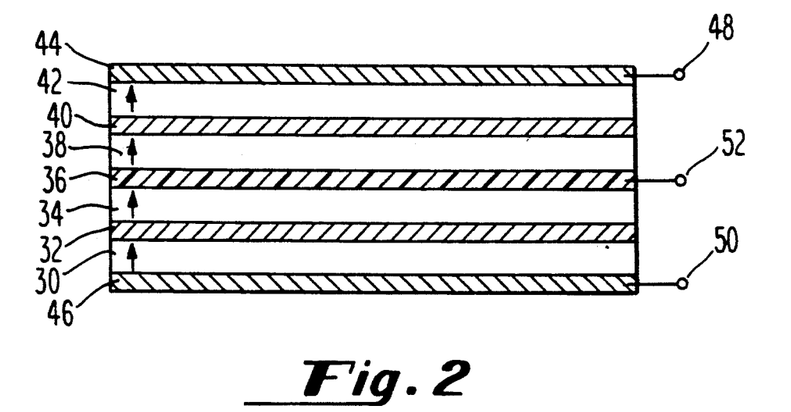
FIG. 2 is a cross sectional view of an alternative piezoelectric transducer of the present invention with an electroconductive layer interposed between two of the piezoelectric films for adjusting the capacitance of the stacked assembly.

Referring now to FIG. 2, an alternative piezoelectric transducer containing the capacitance adjustment layer 36 is shown. This transducer contains first and second polarized piezoelectric films 30 and 34, respectively, which are laminated together with the evaporated nonconductive solution layer 32. Then, an additional solution layer 36 which contains electroconductive particles is applied to the exposed major surface of the second piezoelectric film 34. A third polarized piezoelectric film 38 is applied to the solution wetted surface containing the electroconductive particles and the solvent is evaporated. The dried layer 36, having a thickness of between about 2 to about 3 mils, forms the capacitance adjustment layer.

An additional nonconductive solution layer 40 is applied to the third piezoelectric film 38. Finally, a fourth piezoelectric film 42 is applied and bonded to form the stacked assembly. Then the electrodes 44 and 46 are formed using the previously described techniques. Electrical connections 48, 50 and 52 are then made to the respective layers with a conductive epoxy or solder. Since the individual transducer units are connected in parallel, the capacitance of the transducer unit as a whole is increased.

Figure 3:
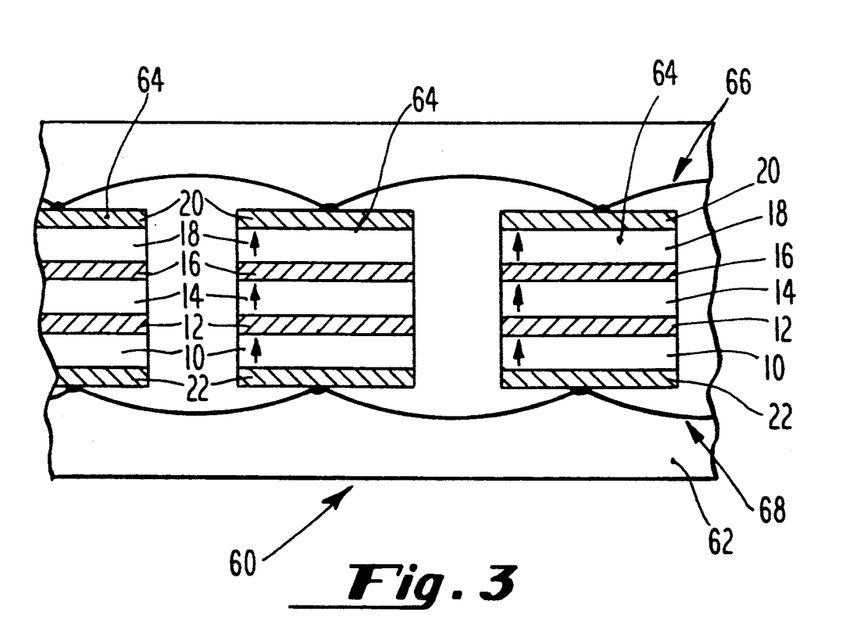
FIG. 3 is a cross sectional view of the hydrophone of the present invention employing the piezoelectric structure fabricated by the process illustrated in FIGS. 1a through 1e.

Referring now to FIG. 3, a cross section of a hydrophone generally identified as 60 is shown. This hydrophone contains a plurality of the piezoelectric transducers, produced by the process of FIGS. 1a through 1e, which are embedded in an oil filled rubber boot 62. The electrodes of the hydrophone tiles 64 are electrically connected with the conductors 66 and 68. These hydrophones can be formed in long continuous tapes and are particularly useful for towing behind ships. The tiles 64, ranging in sizes between about $\frac{1}{2} \times \frac{1}{2}$ inch to about $3 \times 3$ inches, are electrically connected by soldering and then inserted in the boot 62.

Figure 4A:
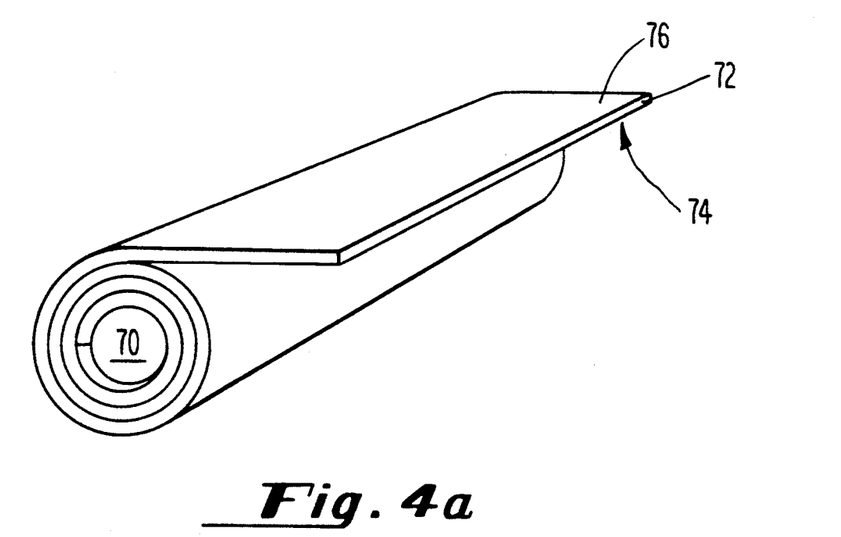
FIGS. 4a and 4b are isometric views illustrating an alternative process of the present invention for forming a laminated cylindrical piezoelectric transducer.
Figure 4B:
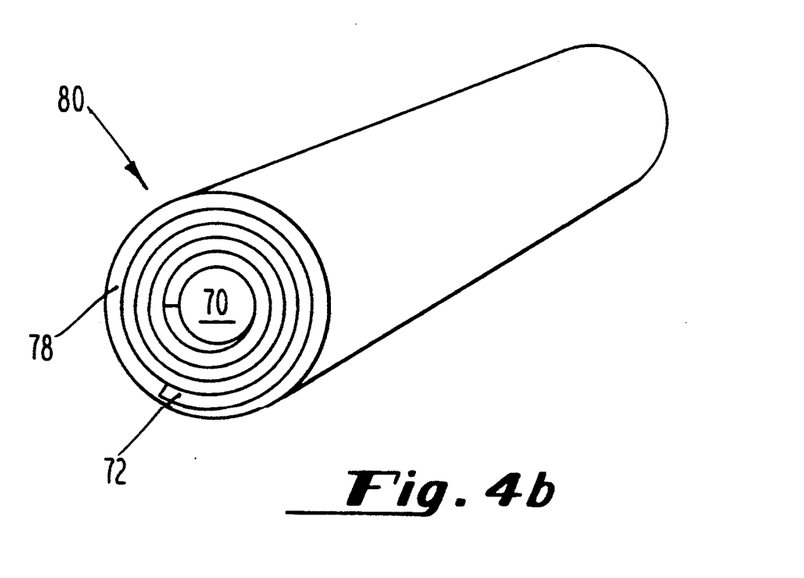

Referring now to FIGS. 4a and 4b, the process of forming the laminated cylindrical piezoelectric transducer of the present invention will be described. As shown in FIG. 4a, this process begins with an electroconductive conduit 70. The conduit 70 can be a metallic tube, such as copper or stainless steel, having an outside diameter of between about 0.25 to about 0.5 inch. The wall thickness for the metallic tube generally ranges between about 5 to about 30 mils. A metallized plastic conduit can also be used as the electroconductive conduit 70. The outer surface of the electroconductive conduit 70 is coated with an adhesive which will allow for electrical conduction with a subsequently applied polarized piezoelectric film comprising the $VF_2$-$VF_3$ copolymer. A thin adhesive layer, such as about 0.01 inch of an elastomeric polyurethane adhesive like Tycel (TM), or conventional electrically conductive adhesives, such as a conductive epoxy, are used.

A first surface 74 of a polarized piezoelectric film 72 is coated with the solvent welding solution comprising the copolymer of vinylidene fluoride and trifluoroethylene as previously described for FIG. 1a. The piezoelectric film 72 is then wrapped around the electroconductive conduit in a scroll-like manner to form a continuous layered structure. The piezoelectric film 72, having a thickness of between about 100 to about 500 microns, is wrapped around the electroconductive conduit 70 to virtually any thickness, but a total film thickness of between about 1 to about 4 millimeters is preferred. As the solvent wetted first surface 74 contacts the second surface 76 of the piezoelectric film 72, the layers become solvent welded together within a thin layer of the copolymer (not shown) when the solvent evaporates. The assembly can be heated in an oven to a temperature of about 60° to about 80° C. to evaporate the solvent.

Turning to FIG. 4b, after the solvent has been evaporated, an outer electrode 78 is formed over the assembly. The electrode 78 can be applied by electroplating, vacuum evaporating, or sputtering metals in the manner previously described for FIG. 1e. A conductive ink, such as silver filled polymer ink, may also be used as the outer electrode 78. A braided metal jacket, such as copper, can also be slipped around the assembly and used as the outer electrode 78. Electrical connections are then made with the electroconductive conduit 70, which forms the inner electrode, and the outer electrode 78 by conventional soldering techniques or with a conductive epoxy adhesive. If a metallized plastic conduit is used as the conduit 70, then the electrical contact is made with the outer metallized surface facing the piezoelectric film 72.

Because of the cylindrical shape, the surface area of the transducer 80 is sufficiently large thereby increasing the capacitance of the device. This increased capacitance reduces the amount of amplification circuitry needed for the transducer 80. The electroconductive conduit 70 also provides a passageway through which the system electronics and wiring may be housed in a shielded environment. The transducer 80 can be cut into lengths as small as ½ inch and fabricated into a hydrophone as previously described for FIG. 3. The rounded shape of the transducer also helps to minimize flow noise when a cable containing the transducer 80 is towed underwater.

Figure 5A:
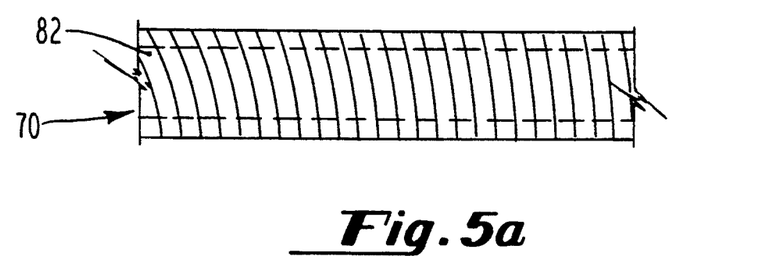
FIGS. 5a through 5c are side views illustrating a further alternative process of the present invention for forming a laminated cylindrical piezoelectric transducer from a plurality of piezoelectric film ribbons.
Figure 5B:
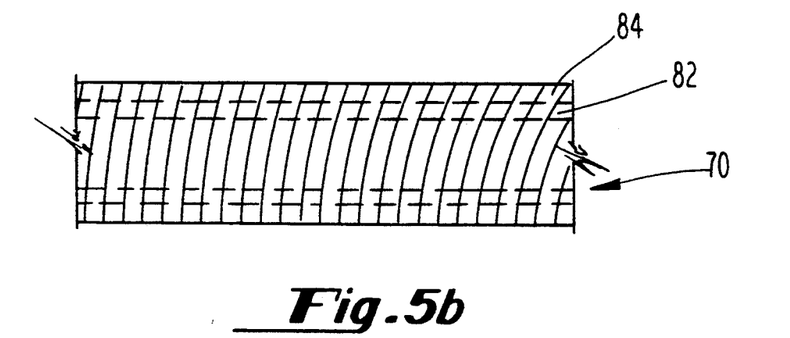
Figure 5C:
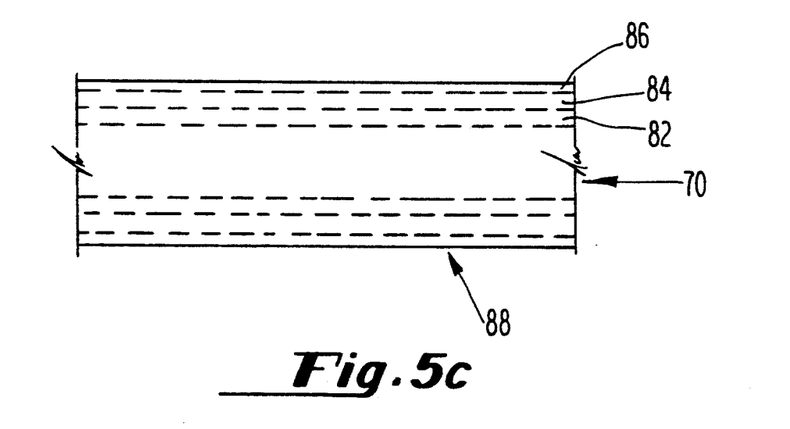

Referring now to FIGS. 5a through 5c, an alternative process to the process illustrated in FIGS. 4a and 4b will be described. In the process illustrated by FIGS. 5a through 5c, a plurality of piezoelectric film ribbons, rather than a single piezoelectric film sheet as illustrated in FIGS. 4a, are wrapped around the electroconductive conduit 70. Like reference numerals in FIGS. 4a and 4b and FIGS. 5a through 5c indicate like elements.

As shown in FIG. 5a, a first polarized piezoelectric film ribbon 82 is spirally wrapped around the adhesive coated electroconductive conduit 70 used in FIG. 4a. The piezoelectric film ribbons used in this process are cut from polarized piezoelectric film sheets to widths ranging between about ⅛ to about 1 inch, preferably about ⅛ to about ¼ inch. As shown in the figure, the first piezoelectric film ribbon 82 is wrapped so that each turn is butt joined. Alternatively, the piezoelectric film ribbon may be wrapped around the electroconductive conduit 70 so that a portion of each turn overlaps the adjacent turn or so that each turn is spaced apart by a gap.

Now viewing FIG. 5b, a second polarized piezoelectric film ribbon 84 with its inner surface coated with the solvent welding solution comprising vinylidene fluoride and trifluoroethylene is spirally wrapped around the first piezoelectric film ribbon 82. Although the figure shows that the pitch of each turn is different from that used in FIG. 5a, virtually any wrapping sequence may be employed so long as the surface of the first piezoelectric film ribbon 82 is substantially covered. The two piezoelectric film ribbons 82 and 84 become solvent welded together with a thin layer of the copolymer when the solvent evaporates. Heat may also be used to evaporate the solvent after each layer is applied.

Additional polarized piezoelectric film ribbons are applied as necessary to increase the total film thickness to the levels previously described for the scroll wrapped transducer. The piezoelectric films are arranged so that their polarization axes are perpendicular to the surface of the tube. After the final layer is applied, an outer electrode layer 86 (FIG. 5c) is applied and electric connections are made using the techniques described for FIG. 4b.

As shown in FIGS. 6a through 10b, the laminating process of the present invention will be used to form a piezoelectric transducer on a semiconductor substrate. Like reference numerals between the figures indicate like elements. Viewing FIG. 6a, the process begins with a semiconductor substrate 90, such as a silicon wafer, which is conventionally used to form an integrated circuit. The semiconductor substrate 90 contains a first electrode layer 91 disposed on its bottom surface. The first electrode layer 91 may be formed using conventional techniques, such as vacuum evaporating or sputtering a thin film metal, screen printing an electroconductive ink, or laminating a foil layer to the underside of the semiconductor substrate 90. Alternatively, the first electrode layer 91 can be formed on semiconductor 90 after the first film layer 92 has been applied.

Figure 6A:
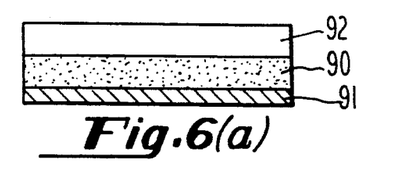

A first film layer 92 of an unpolarized vinylidene fluoride-trifluoroethylene copolymer is applied to the upper surface of the semiconductor substrate 90 by casting or spin coating a solution of the copolymer. The copolymer of the solution contains about 60 to 90, preferably about 70 to 85, mole percent vinylidene fluoride and about 10 to 40, preferably about 15 to 30, mole percent trifluoroethylene. This copolymer is then added to a solvent, such as acetone, ethyl acetate, dimethylformamide, and, preferably, methyl ethyl ketone, to form a solution containing from about 10 to about 30 weight percent of the copolymer. This solution is then coated onto the semiconductor substrate 90 at room temperature. The thickness of the first copolymer film layer 92 depends on the concentration of the solution which is applied, but, typically, it is applied to a dried thickness of between about 1 to about 50 microns depending on the intended end use. After spinning or casting, the solvent in the first film layer 92 is evaporated by air drying or heating to a temperature between about 60° to about 80° C. for approximately one hour.

Figure 7A:
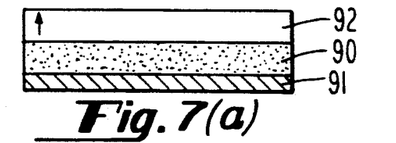

A suitable polarization voltage is then applied between the first electrode layer 91 and the top surface of the first copolymer film layer 92 to polarize and thereby enhance the piezoelectric characteristics of the film 92 (FIG. 7a). For example, a polarization voltage is applied between the first electrode 91 and the top surface of the copolymer film 92 with a corona discharge. Alternatively, a temporary top electrode (not shown) is applied to the upper surface of the copolymer film 92 so that the film 92 may be poled directed by applying a voltage between the two electrodes. When using either of these techniques, since the first electrode 91 is positioned on the bottom of the semiconductor substrate 90, polarization occurs through the semiconductor substrate. The poling conditions used to carry out such a polarization of the film layer 92 on a semiconductor substrate, such as silicon, are substantially the same as those conventionally employed to polarize the vinylidene fluoride-trifluoroethylene copolymer film per se.

Figure 6B:
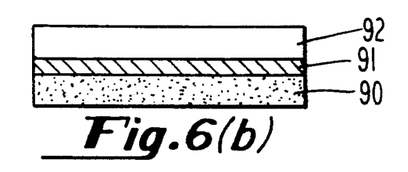
Figure 7B:
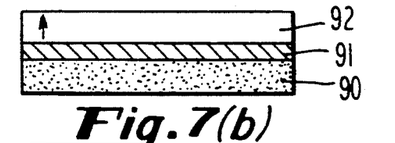

FIGS. 6b and 7b illustrate an alternative technique for applying the first electrode layer 91. As shown in FIG. 6b, the first electrode layer 91 is applied to the upper surface of the semiconductor substrate 90. After the layer 91 is applied, small sections may be removed by etching or the laser techniques to isolate the desired circuitry schemes on the semiconductor substrate. For example, when the semiconductor substrate contains operational amplifiers, several interconnections are made to the piezoactive element. The first copolymer film layer 92 is then applied over the first electrode layer 91 using casting or spin coating techniques. As shown in FIG. 7b, the first copolymer film layer 92 is then polarized as previously discussed so as to form the first polarized piezoelectric film 92.

If the first copolymer film layer 92 in FIGS. 6a and 6b was formed on the semiconductor substrate 90 and the first electrode layer 91, respectively, by adhesively applying a polarized piezoelectric film, rather than by coating as in the present invention, several film requirements would not be met. Such requirements include film flatness and thickness uniformity, good optical and acoustic impedance properties, and the lack of air bubbles or section delaminations at the film interface. The presence of an adhesive layer also affects the capacitance and the backing properties of the substrate in ultrasound applications.

In some applications, a single layer of piezoelectric film would be suitable for the desired end use. Therefore, an electrode would be formed over the upper surface of the first polarized piezoelectric film layer 92.

Many end use applications, however, require a polarized piezoelectric film thickness which is greater than about 30 to about 50 microns, which is the maximum thickness that can be reasonably achieved used either casting or spin coating techniques. Such applications include accelerometers, ultrasound devices and hydrophones.

In order to increase the thickness of the active piezoelectric film layer, the solvent welding technique previously described ar used to add additional polarized piezoelectric films. The additional polarized piezoelectric films can not be solvent cast or spin coated because the solvent would degrade the underlying polarized piezoelectric film. Furthermore, there would be no immediate bottom electrode available for the polarization of the solution cast or spin coated layer.

Figure 8:
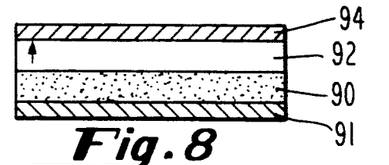

As shown in FIG. 8, a layer 94 of the solvent welding solution is applied to the structure of FIG. 7a using the techniques previously described for FIG. 1a. It should be understood that the same technique could be employed with the structure of FIG. 7b.

Figure 9A:
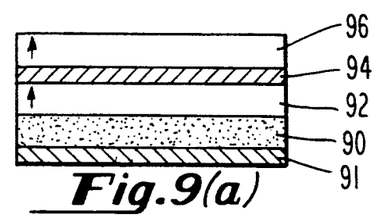
Figure 9B:
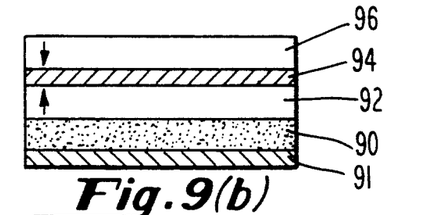

A second polarized piezoelectric film 96 (FIG. 9a) is then applied to the layer 94 of the solvent welding solution. The solvent is then allowed to evaporate as previously described, and the second piezoelectric film layer 96 becomes solvent welded to the first piezoelectric film 92. As shown in FIG. 9a, the polarization directions of the two piezoelectric film layers 92 and 96 are in-line, however, the second piezoelectric film 96 may also be oriented so that the polarization directions are opposite (FIG. 9b). The polar alignment of the two piezoelectric film layers depend upon their end use. Such end uses are widely described in piezoelectric film applications literature. For example, optical mirrors benefit by opposing polar directions, while ultrasound transmitters and hydrophones benefit by aligning the polar directions of the piezoelectric films.

Figure 10A:
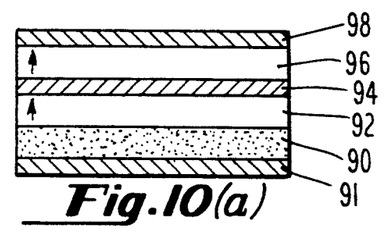
Figure 10B:
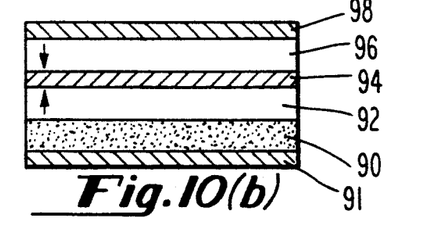

Additional piezoelectric films may be solvent welded to build the piezoelectric laminate to the desired thickness. Then, as shown in FIGS. 10a and 10b, the process is completed by applying a second electrode layer 98 over the exposed surface of the polarized second piezoelectric film 96.

Figure 11:
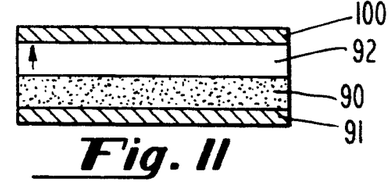
FIGS. 11 through 13 are cross sectional views illustrating an alternative process to that illustrated in FIGS. 6a through 10b wherein an electroconductive layer is interposed between two of the piezoelectric films.
Figure 12:
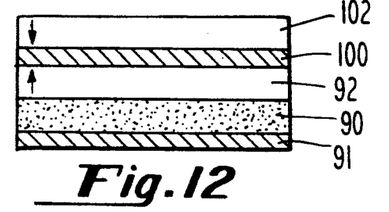
Figure 13:
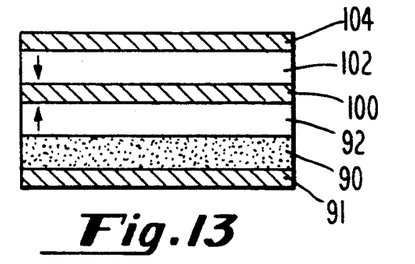

In instances where high capacitance is required, or where the piezoelectric film layers are to be wired in series or parallel, the process illustrated by FIGS. 11 through 13 is employed. As shown in FIG. 11, an intermediate electroconductive layer 100 is applied to the exposed surface of the polarized film layer of the structure shown in FIG. 7a. Alternatively, the process of FIGS. 11 through 13 may also be used with the structure illustrated in FIG. 7b. The intermediate electroconductive layer 100 is applied to the polarized piezoelectric film surface 92 in FIG. 11 using conventional thin film deposition techniques, such as vacuum evaporating or sputtering a metal layer. The intermediate electroconductive layer 100 has a thickness which is approximately equal to that of the first electrode layer 91. Alternatively, instead of using a deposited metal layer, the intermediate electroconductive layer 100 may be formed by applying the solvent welding solution which contains the electroconductive particles as previously described for layer 36 in FIG. 2.

As shown in FIG. 12, a second polarized piezoelectric film 102 is then formed on the intermediate electroconductive layer 100. If the intermediate electroconductive layer 100 is a deposited thin film metal, the second piezoelectric film layer 102 is applied by solvent casting or spin coating, and then polarizing using the steps of FIGS. 6b and 7b. If, however, the intermediate electroconductive layer 100 is the solvent welding solution with electroconductive particles, then a second polarized piezoelectric film 102 is applied and laminated to the first piezoelectric film layer 92 when the solvent of the solution is evaporates.

Turning now to FIG. 13, a second electrode layer 104 is then applied over the second polarized piezoelectric film layer 102 to complete the device.

The electrodes and the intermediate electroconductive layers of the transducers produced by the processes of FIGS. 6a through 13 can be patterned by using conventional laser removal or other etching techniques so that suitable interconnections can be made with the circuitry on the semiconductor substrate. Plated through-holes, wire bonding and edge connections are techniques suitable for forming such interconnections. Conventional depolarization and reverse polarization techniques may be used with the piezoelectric films formed on the semiconductor substrate. For example, the patterned electrodes and the intermediate electroconductive layer can be used to reverse the polarization of a specific piezoelectric film layer by simply applying the proper reverse polarization voltage. A laser can also be used to selectively depolarize or, when used as a thermal source, to selectively reverse polarize selective areas of the piezoactive region of the device.

Figure 14:
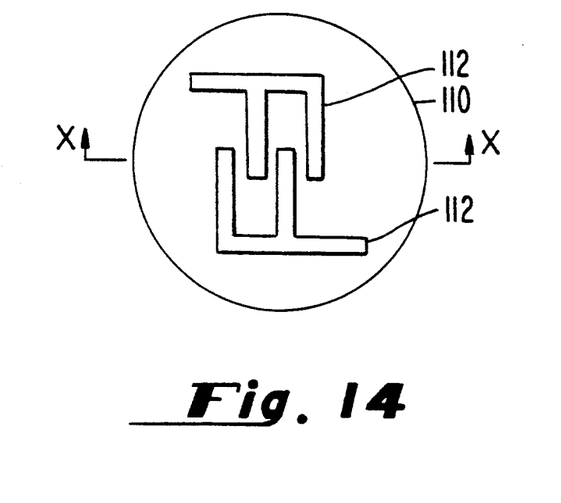
FIGS. 14 and 15 are plan and cross sectional views, respectively, of the substrate used in an alternative process of the present invention for forming a piezoelectric transducer on a semiconductor substrate.

FIGS. 14 through 18 illustrate a further process of the present invention for forming a piezoelectric transducer on a semiconductor substrate. As shown in FIG. 14, the process begins with a semiconductor substrate 110, such as p-type or n-type doped silicon, conventionally used to form an integrated circuit. A first electroconductive layer 112 is formed on the surface of the semiconductor substrate 110. This electroconductive layer 112 is selectively patterned to cover the areas of the semiconductor substrate 110 where the piezoelectric transducers are to be located. The remaining exposed portions of the semiconductor substrate 110 may be used to form other circuits, such as MOS transistors.

Figure 15:
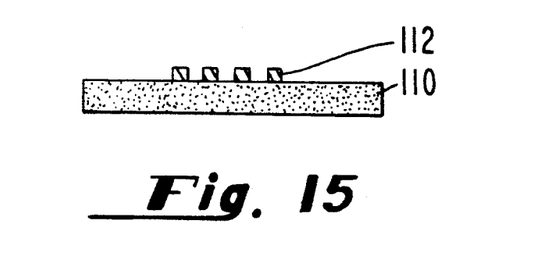

The first electroconductive layer 112 is formed and patterned using the techniques described with the process of FIG. 6a-13. Although the first electroconductive layer 112 shown in FIG. 14 has two electrically unconnected regions, virtually any number of electrically unconnected regions or other pattern designs may be employed. For example, the first electroconductive layer 112 may be continuous to cover substantially all of one face of the semiconductor substrate 110. FIG. 15 is a cross sectional view taken along line X—X of FIG. 14.

Figure 16:
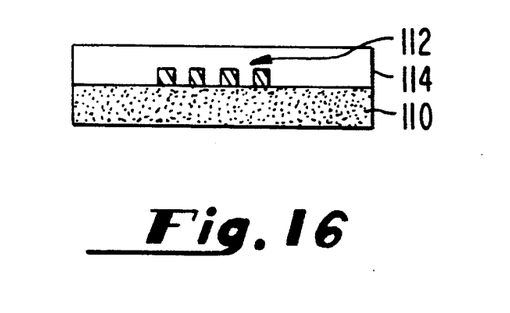
FIGS. 16 through 18 are cross sectional views further illustrating the process of the present invention for forming a piezoelectric transducer on the semiconductor substrate of FIGS. 14 and 15.

Turning now to FIG. 16, a first layer 114 of the vinylidene fluoride-trifluoroethylene copolymer is applied over the first electroconductive layer 112 and the exposed regions of the semiconductor substrate 110 by casting or spin coating a solution of the copolymer. After drying, the first layer 114 of the unpolarized vinylidene fluoride-trifluoroethylene copolymer is polarized using of the techniques shown in FIGS. 17a, 17b or 17c.

Figure 17A:
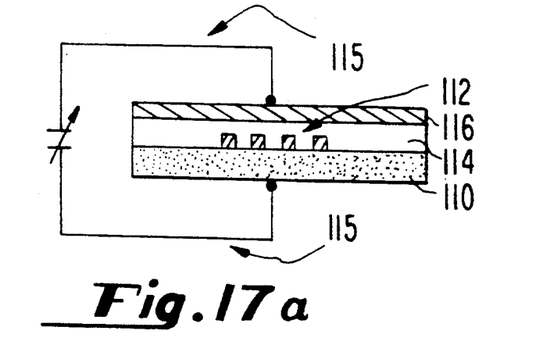

In FIG. 17a, a second electroconductive layer 116 is formed over the upper exposed surface of the copolymer layer 114. Then, an electrical field is applied across the semiconductor substrate 110 and the second electrode 116 to polarize the copolymer layer 114. The first electroconductive layer 112 is not directly connected to the power supply leads 115 during the poling step.

Thus, the vinylidene fluoride-trifluoroethylene copolymer layer 114 is uniformly polarized because the semiconductor substrate 110 functions as one of the poling electrodes. The output lead 115 from the voltage source may be in direct contact with the semiconductor substrate 110 or attached with solder or a conductive adhesive. Alternatively, a temporary electrode may be formed on, or an electroconductive plate, such as graphite filled polyethylene, may be disposed against the bottom surface of the semiconductor substrate 110 to facilitate electrical connection with the output lead 115.

Figure 17B:
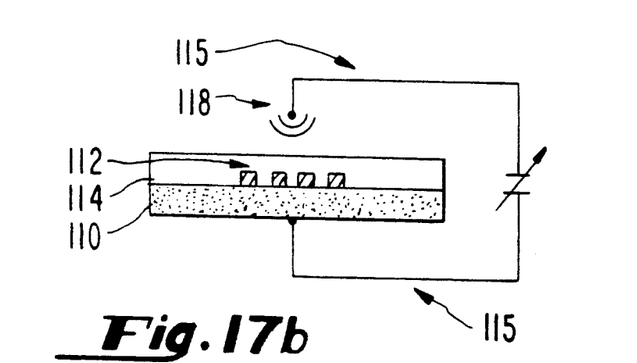

An alternative poling scheme using a corona discharge is shown in FIG. 17b. Since the corona pin 118 is in close proximity to the vinylidene fluoride-trifluoroethylene copolymer layer 114, it is not necessary to employ the second electroconductive layer 116. It should be understood, however, that the second electroconductive layer 116 may be used during the corona poling operation. The poling voltage source is also electrically coupled to the semiconductor substrate 110 during the corona poling operation via the lead 115. As with the direct poling operation shown in FIG. 17a, the first electroconductive layer 112 is not directly connected to the power supply leads 115 during the poling step. In either of these poling operations, the voltage is slowly brought up to a maximum field of approximately 50–100 megavolts per meter. This field is maintained for approximately 10 minutes.

Figure 17C:
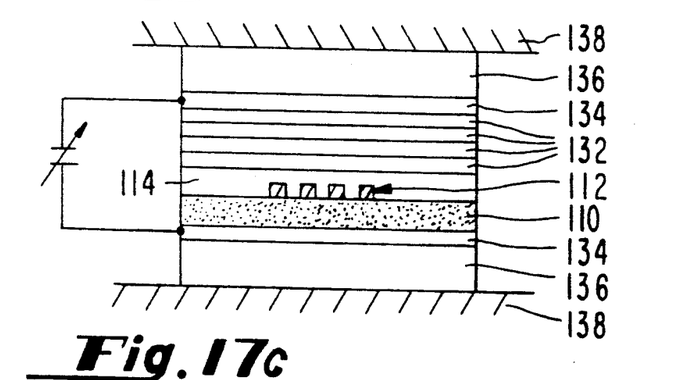

The vinylidene fluoride-trifluoroethylene copolymer layer 114 may also be polarized using the press poling technique shown in FIG. 17c. A pluality of unpolarized vinylidene fluoride-trifluoroethylene ($VF_2-VF_3$) copolymer films 132, each having a thickness of about 50 microns, are stacked on the exposed upper surface of the copolymer layer 114 formed on the semiconductor substrate 110. Other polymeric films having resistivities approximately equal to the resistivity of the copolymer layer 114, such as a vinylidene fluoride-tetrafluoroethylene copolymer, may also be employed as the films 132. The films 132 provide a more uniform poling field and help to reduce breakdown of the copolymer layer 114 due to pinholes and burnthrough.

A pair of electrodes 134 and 136, such as conductive polyethylene films having a thickness of about 5 mils, is disposed adjacent the unpolarized $VF_2-VF_3$ films 132 and the semiconductor substrate 110. A cushion 136 is positioned on the face of the platens 138. The cushion 136 may consist of a series of alternating 0.125 inch thick silicon rubber and 0.06 inch thick polyethylene layers.

An electrical field is slowly applied to the electrodes 134 until a voltage of about 50 to about 100 megavolts per meter is achieved. During this step, the platens 138 maintain a pressure of from about 50 to about 150 psi on the copolymer layer 114. These conditions are maintained for approximately 5 to 30 minutes. After poling, the stack of films 132 is removed from the surface of the now polarized copolymer layer 114.

After the poling steps shown in FIGS. 17a, 17b or 17c are completed, additional piezoelectric copolymer layers may be laminated to the first layer 114 using the lamination techniques described in the present invention.

Figure 18:
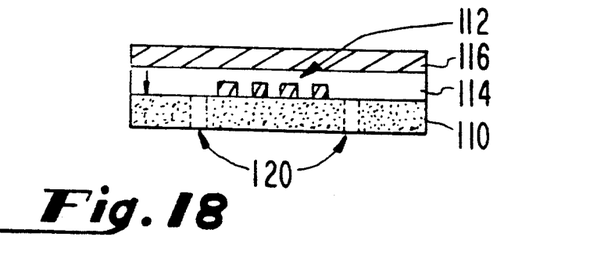

Turning now to FIG. 18, electrical connections are then made to each of the electrically unconnected regions of the patterned first electroconductive layer 112 by forming through-holes 120 in the semiconductor substrate 110. The through-holes may be formed by drilling or etching the semiconductor substrate 110. Then, they are plated or filled with a conductive adhesive so as to provide a conductive path to the electroconductive layer 112.

The process of FIGS. 14–18 is particularly useful when forming circuits containing many piezoelectric transducers since one does not need to access the patterned electroconductive layer 112 during poling If first electroconductive layer 112 was used as the poling electrode, rather than the semiconductor substrate 110, each individual sensor region would have to be spot-poled and this would be very labor intensive in circuits containing hundreds or thousands of discrete piezoelectric sensors. This technique may be used to form virtually any type of piezoelectric or pyroelectric sensor, including, without limitation, ultrasonic transducers. The unused portions of the semiconductor substrate shown in FIG. 18 may house interface electronics, such as preamps, or the entire structure, with the through-holes 120, can be mounted on a separate semiconductor substrate which houses these additional circuits.

EXAMPLE

Two 3 inch by 3 inch sheets of extruded copolymer film (75 mol. % $VF_2$ and 25 mol. % $VF_3$) were polarized in a press by conventional poling techniques. The major surfaces of the poled copolymer films were roughened by sand blasting and then vapor decreased. The films were then dried overnight in an oven at 60 degrees C. A solvent welding solution was prepared by dissolving 20 weight parts of powdered copolymer (75 mol. % $VF_2$ and 25 mol. % $VF_3$) into 80 weight parts of methyl ethyl ketone. A 1.3 mil layer of the solvent welding solution was then applied with a doctor blade to the positive side of one of the poled copolymer films and to the negative side of the other poled copolymer film. The solvent wetted faces were brought into contact and placed in a heated press at 60 degrees C. and at 3000 psi. After more than 8 hours the films, now solvent welded together as a laminate, were removed from the press.

Two 3×3 inch low carbon steel plates (6 mil) having one side plated with 1 mil of copper were used as the electrodes. The steel side of these electrodes were lightly sand blasted, vapor decreased and dried. The steel sides were then primed with an adhesion promoter (CHEMLOC AP 134 available from Lord Corp., Erie, Pa.). The adhesion promoter was applied to the prepared surfaces with a brush at thickness of approximately ½ mil.

A two part urethane adhesive, TYCEL 7001 and 7200 (TM) available from Lord Corp., was mixed in a ratio of 20:1 (TYCEL 7001:TYCEL 7200) and then degassed in a low vacuum to eliminate any bubbles. This adhesive was applied to the primed surfaces of the electrodes and to the exposed major surfaces of the stacked copolymer films with a doctor blade at a thickness of approximately 1.3 mils. The adhesive coated surfaces were then dried for 5 minutes at 60 degrees C. to drive off some of the solvents.

The adhesive coated surfaces of the electrodes were pressed against either side of copolymer laminate. The entire assembly was then placed on a heated press at 60 degrees C. and at a pressure of 3000 psi for 8 hours. The laminated structure was then machined to the desired tile length and width dimensions using conventional milling techniques.

The laminated tiles were then tested in an oil filled chamber for their hydrostatic sensitivity. The electrical response of each tile was monitored when a pressure pulse of 100 psi (1 kHz spike) was applied to the oil filled chamber with a pneumatic cylinder. The ambient pressure within the tank ranged between atmospheric up to about 1000 psi. The sensitivity was measured at −192 dB at 1 V/μPa.

The capacitance of the laminated tiles was measured as 385 picofarads using a Hewlett Packard LCR bridge.

Copper strand leads (26 gage) were applied to the copper side of each electrode using a conventional lead-tin solder. A plurality of laminated tiles were then wired in parallel to form an indefinite length string.

We claim:

1. A process of forming a laminated piezoelectric structure, comprising the steps of:
    (a) providing a plurality of polarized piezoelectric films comprising a copolymer of vinylidene fluoride and trifluoroethylene;
    (b) interposing between and in surface contact with said films a solution comprising a copolymer of vinylidene fluoride and trifluoroethylene and a suitable solvent; and
    (c) evaporating substantially all of the solvent of said solution thereby laminating said piezoelectric films.

2. A process according to claim 1, further comprising the steps of:
    applying an electroconductive layer over the exposed major surface of one of the outermost piezoelectric films; and
    applying an additional electroconductive layer over the exposed major surface of the other of the outermost piezoelectric films.

3. A process according to claim 2 wherein said piezoelectric films are polarized in substantially the same direction.

4. A process according to claim 2 wherein said piezoelectric films are polarized in substantially opposed directions.

5. A process according to claim 3 wherein said solution applied between at least two of said piezoelectric films further comprises finely divided electroconductive particles.

6. A process according to claim 5 wherein said electroconductive particles are silver.

7. A process according to claim 1 wherein step (c) is carried out at an elevated temperature and pressure.

8. A process according to claim 7 wherein step (c) is carried out in a press with platens heated to about 50°-60° C.

9. A process according to claim 1 wherein step (a) includes at least three polarized piezoelectric films.

10. A process according to claim 1, further comprising the steps of:
    providing an additional polarized piezoelectric film comprising a copolymer of vinylidene fluoride and trifluoroethylene;
    interposing between and in surface contact with the exposed surface of one of the previously laminated piezoelectric films and said additional piezoelectric film a solution comprising a copolymer of vinylidene fluoride and trifluoroethylene and a suitable solvent; and
    evaporating substantially all of the solvent of said solution thereby laminating said additional piezoelectric film with said previously laminated piezoelectric films.

11. A product produced by the process of claim 1.

12. A product produced by the process of claim 2.

13. A product produced by the process of claim 5.

14. A process of forming a laminated piezoelectric transducer, comprising the steps of:
    (a) providing a plurality of polarized piezoelectric films comprising a copolymer of about 60 to about 95 mole percent vinylidene fluoride and about 5 to about 40 mole percent trifluoroethylene;
    (b) interposing between and in surface contact with said films a solution comprising a copolymer of about 60 to about 95 mole percent vinylidene fluoride and about 5 to about 40 mole percent trifluoroethylene;
    (c) evaporating under an elevated temperature and pressure substantially all of the solvent thereby laminating said piezoelectric films;
    (d) applying an electroconductive layer over the exposed major surface of one of the outermost piezoelectric films; and
    (e) applying an additional electroconductive layer over the exposed major surface of the other of the outermost piezoelectric films.

15. A process according to claim 14 wherein said solution comprises about 20 to about 40 weight percent of the copolymer.

16. A process according to claim 15 wherein said solvent is selected from the group consisting of acetone, methyl ethyl ketone, and ethyl acetate.

17. A process according to claim 14 wherein the solution applied between at least two of said piezoelectric films further comprises finely divided electroconductive particles.

18. A process according to claim 17 wherein the solution having the finely divided electroconductive particles comprises:
    about 9 to about 24 weight percent of the copolymer of vinylidene fluoride and trifluoroethylene;
    about 12 to about 28 weight percent of silver flake; and
    about 60 to about 70 weight percent of the suitable solvent.

19. A process according to claim 18 wherein the solution having the finely divided electroconductive particles comprises:
    about 12 to about 16 weight percent of the copolymer of vinylidene fluoride and trifluoroethylene;
    about 18 to about 24 weight percent of silver flake; and
    about 60 to about 70 weight percent of the suitable solvent.

20. A process according to claim 14 wherein step (c) is carried out in a press with platens heated to about 50°-60° C.

21. A process according to claim 14 wherein said solution is interposed at a thickness of about 0.25 to about 3 mils between said films.

22. A process according to claim 14 wherein said polarized piezoelectric films have a thickness of at least about 100 microns.

23. A product produced by the process of claim 14.

24. A product produced by the process of claim 17.

25. A piezoelectric transducer, comprising:
    a plurality of stacked polarized piezoelectric films comprising a copolymer of vinylidene fluoride and trifluoroethylene laminated together with an evaporated solution which comprised a copolymer of vinylidene fluoride and trifluoroethylene and a suitable solvent, and a pair of electrodes sandwiched around the laminated stack of polarized piezoelectric films.

26. A piezoelectric transducer according to claim 25, further comprising:
finely divided electroconductive particles in the evaporated solution disposed between at least two of the piezoelectric films.

27. A hydrophone, comprising:
a plurality of transducers comprising
a plurality of stacked polarized piezoelectric films comprising a copolymer of vinylidene fluoride and trifluoroethylene laminated together with an evaporated solution which comprised a copolymer of vinylidene fluoride and trifluoroethylene and a suitable solvent, and
a pair of electrodes sandwiched around the laminated stack of polarized piezoelectric films; and means for electrically coupling the electrodes of said transducers to form a plurality of interconnected transducers.

28. A hydrophone according to claim 27 wherein said electrodes comprise an aluminum-silicon carbide composite.

29. A hydrophone according to claim 27, further comprising:
finely divided electroconductive particles in the evaporated solvent disposed between at least two of the piezoelectric films.

30. A process of forming a laminated piezoelectric transducer, comprising the steps of:
(a) applying an adhesive layer to the outer surface of an electroconductive conduit, said adhesive layer is selected to allow for electrical conduction between said conduit and a subsequently applied polarized piezoelectric film;
(b) applying a solution comprising a copolymer of vinylidene fluoride and trifluoroethylene and a suitable solvent to one major face of a polarized piezoelectric film comprising a copolymer of vinylidene fluoride and trifluoroethylene;
(c) wrapping said polarized piezoelectric film around said conduit so that said major face containing said solution faces said conduit;
(d) evaporating substantially all of the solvent of said solution thereby laminating adjacent turns of said polarized piezoelectric film; and
(e) applying an electroconductive layer over the exposed outer surface of said polarized piezoelectric film.

31. A process according to claim 30 wherein said polarized piezoelectric film in step (c) is scrolled around said conduit.

32. A process according to claim 31 wherein said copolymer of said polarized piezoelectric film and said solution comprises from about 60 to about 95 mole percent vinylidene fluoride and from about 5 to about 40 mole percent trifluoroethylene.

33. A process according to claim 31 wherein said solution comprises about 20 to about 40 weight percent of said copolymer.

34. A process according to claim 33 wherein the solvent of said solution is selected from the group consisting of acetone, methyl ethyl ketone, and ethyl acetate.

35. A product produced by the process of claim 30.

36. A product produced by the process of claim 34.

37. A piezoelectric transducer, comprising
a polarized piezoelectric film comprising a copolymer of vinylidene fluoride and trifluoroethylene scrolled around an electroconductive conduit having an adhesive layer which allows for electrical conduction between said conduit and said piezoelectric film, and wherein adjacent turns of the scrolled polarized piezoelectric film are laminated together with an evaporated solution which comprised a copolymer of vinylidene fluoride and trifluoroethylene and a suitable solvent; and
an electroconductive layer disposed over the exposed outer surface of said polarized piezoelectric film.

38. A hydrophone, comprising:
a plurality of transducers comprising
a polarized piezoelectric film comprising
a copolymer of vinylidene fluoride and trifluoroethylene scrolled around an electroconductive conduit having an adhesive layer which allows for electrical conduction between said conduit and said piezoelectric film and wherein adjacent turns of the scrolled polarized piezoelectric film are laminated together with an evaporated solution which comprised a copolymer of vinylidene fluoride and trifluoroethylene and a suitable solvent, and
an electroconductive layer disposed over the exposed outer surface of said polarized piezoelectric film; and
means for electrically coupling the electroconductive conduits and said electroconductive layers to form a plurality of interconnected transducers.

39. A process of forming a laminated piezoelectric transducer, comprising the steps of:
(a) applying an adhesive layer to the outer surface of an electroconductive conduit, said adhesive layer is selected to allow for electrical conduction between said conduit and a subsequently applied polarized piezoelectric ribbon;
(b) spirally wrapping a first polarized piezoelectric ribbon comprising a copolymer of vinylidene fluoride and trifluoroethylene around said conduit;
(c) applying a solution comprising a copolymer of vinylidene fluoride and trifluoroethylene and a suitable solvent to one major face of an additional polarized piezoelectric ribbon comprising a copolymer of vinylidene fluoride and trifluoroethylene;
(d) spirally wrapping the additional polarized piezoelectric ribbon around said conduit so that said major face containing said solution contacts said first polarized piezoelectric ribbon;
(e) evaporating substantially all of the solvent of said solution thereby laminating said polarized piezoelectric ribbons; and
(f) applying an electroconductive layer over the exposed surface of the outermost polarized piezoelectric ribbon.

40. A process according to claim 39 wherein steps (c) through (e) are repeated at least once.

41. A process according to claim 39 wherein said copolymer of said first and additional polarized piezoelectric ribbons and said solution comprises from about 60 to about 95 mole percent vinylidene fluoride and from about 5 to about 40 mole percent trifluoroethylene.

42. A process according to claim 39 wherein said solution comprises about 20 to about 40 weight percent of said copolymer.

43. A process according to claim 42 wherein the solvent of said solution is selected from the group consisting of acetone, methyl ethyl ketone, and ethyl acetate.

44. A product produced by the process of claim 39.

45. A product produced by the process of claim 43.

46. A piezoelectric transducer, comprising:
 a first polarized piezoelectric ribbon comprising a copolymer of vinylidene fluoride and trifluoroethylene spirally wrapped around an electroconductive conduit having an adhesive layer which allows for electrical conduction between said conduit and said first polarized piezoelectric ribbon;
 an additional polarized piezoelectric ribbon comprising a copolymer of vinylidene fluoride and trifluoroethylene spirally wrapped around said conduit and laminated to said first polarized piezoelectric ribbon with an evaporated solution which comprised a copolymer of vinylidene fluoride and trifluoroethylene and a suitable solvent; and
 an electroconductive layer disposed over the exposed surface of the outermost polarized piezoelectric ribbon.

47. A hydrophone, comprising:
 a plurality of transducers comprising
 a first polarized piezoelectric ribbon comprising a copolymer of vinylidene fluoride and trifluoroethylene spirally wrapped around an electroconductive conduit having an adhesive layer which allows for electrical conduction between said conduit and said first polarized piezoelectric ribbon;
 an additional polarized piezoelectric ribbon comprising a copolymer of vinylidene fluoride and trifluoroethylene spirally wrapped around said conduit and laminated to said first polarized piezoelectric ribbon with an evaporated solution which comprised a copolymer of vinylidene fluoride and trifluoroethylene and a suitable solvent; and
 an electroconductive layer disposed over the exposed surface of the outermost polarized piezoelectric ribbon; and
 means for electrically coupling the electroconductive conduits and said electroconductive layers to form a plurality of interconnected transducers.

48. A process of forming a piezoelectric transducer on a semiconductor substrate, comprising the steps of:
 (a) coating a layer comprising a copolymer of vinylidene fluoride and trifluoroethylene over a first surface of said semiconductor substrate, said semiconductor substrate having an electroconductive layer disposed over a second surface substantially opposed to said first surface; and
 (b) applying an electrical field across said electroconductive layer and said copolymer layer to polarize said copolymer layer.

49. A process according to claim 48 wherein the copolymer layer of step (a) is spin coated or solution cast onto said semiconductor substrate.

50. A process according to claim 48 wherein a corona discharge is used to polarize said copolymer layer in step (b).

51. A process according to claim 48 wherein a temporary electroconductive layer is applied over the exposed surface of said copolymer layer and said copolymer layer is poled directly in step (b).

52. A process according to claim 48, further comprising the steps of:
 (c) providing a polarized piezoelectric film comprising a copolymer of vinylidene fluoride and trifluoroethylene;
 (d) interposing between and in surface contact with said copolymer layer and said polarized piezoelectric film a solution comprising a copolymer of vinylidene fluoride and trifluoroethylene and a suitable solvent;
 (e) evaporating substantially all of the solvent of said solution thereby laminating said polarized copolymer layer and said polarized piezoelectric film; and
 (f) applying an additional electroconductive layer over the exposed surface of said polarized piezoelectric film.

53. A process according to claim 52, further comprising between steps (e) and (f) the steps of:
 providing an additional film comprising a copolymer of vinylidene fluoride and trifluoroethylene;
 interposing between and in surface contact with the exposed surface of the previously laminated film and said additional film a solution comprising a copolymer of vinylidene fluoride and trifluoroethylene and a suitable solvent; and
 evaporating substantially all of the solvent of said solution thereby laminating said additional film with said previously laminated film.

54. A process according to claim 52 wherein said copolymer of said polarized piezoelectric film, said polarized copolymer layer and said solution comprises from about 60 to about 95 mole percent vinylidene fluoride and from about 5 to about 40 mole percent trifluoroethylene.

55. A process according to claim 52 wherein said solution comprises about 20 to about 40 weight percent of said copolymer.

56. A process according to claim 55 wherein the solvent of said solution is selected from the group consisting of acetone, methyl ethyl ketone, and ethyl acetate and said semiconductor substrate comprises silicon.

57. A product produced by the process of claim 52.

58. A product produced by the process of claim 56.

59. A process of forming a laminated piezoelectric transducer on a semiconductor substrate, comprising the steps of:
 (a) forming an electroconductive layer over a surface of a semiconductor substrate;
 (b) coating a layer comprising a copolymer of vinylidene fluoride and trifluoroethylene over said electroconductive layer;
 (c) applying an electrical field across said electroconductive layer and said copolymer layer to polarize said copolymer layer;
 (d) providing a polarized piezoelectric film comprising a copolymer of vinylidene fluoride and trifluoroethylene;
 (e) interposing between and in surface contact with said polarized copolymer layer and said polarized piezoelectric film a solution comprising a copolymer of vinylidene fluoride and trifluoroethylene and a suitable solvent;
 (f) evaporating substantially all of the solvent of said solution thereby laminating said polarized copolymer layer and said polarized piezoelectric film; and
 (g) applying an additional electroconductive layer over the exposed surface of said copolymer film.

60. A process according to claim 59 wherein the copolymer layer of step (a) is spin coated or solution cast onto said electroconductive layer.

61. A process according to claim 59, further comprising between steps (f) and (g) the steps of:
providing an additional polarized piezoelectric film comprising a copolymer of vinylidene fluoride and trifluoroethylene;
interposing between and in surface contact with the exposed surface of the previously laminated film and said additional film a solution comprising a copolymer of vinylidene fluoride and trifluoroethylene and a suitable solvent; and
evaporating substantially all of the solvent of said solution thereby laminating said additional film with said previously laminated film.

62. A process according to claim 59 wherein said copolymer of said polarized piezoelectric film, said polarized copolymer layer and said solution comprises from about 60 to about 95 mole percent vinylidene fluoride and from about 5 to about 40 mole percent trifluoroethylene.

63. A process according to claim 59 wherein said solution comprises about 20 to about 40 weight percent of said copolymer.

64. A process according to claim 63 wherein the solvent of said solution is selected from the group consisting of acetone, methyl ethyl ketone, and ethyl acetate and said semiconductor substrate comprises silicon.

65. A product produced by the process of claim 59.

66. A product produced by the process of claim 64.

67. A piezoelectric transducer, comprising:
a first polarized piezoelectric layer comprising a copolymer of vinylidene fluoride and trifluoroethylene disposed over a semiconductor substrate having a first electroconductive layer;
an additional polarized piezoelectric layer laminated to said first polarized piezoelectric layer with an evaporated solution which comprised a copolymer of vinylidene fluoride and trifluoroethylene and a suitable solvent; and
an additional electroconductive layer disposed over the exposed surface of the outermost polarized piezoelectric layer.

68. A piezoelectric transducer according to claim 67, further comprising:
a plurality of additional polarized piezoelectric layers laminated together with said evaporated solution.

69. A piezoelectric transducer according to claim 67 wherein said semiconductor substrate comprises silicon.

70. A piezoelectric transducer according to claim 67 wherein said first electroconductive layer is disposed on a surface of said semiconductor substrate which is substantially opposed to the surface of said substrate bearing said first polarized piezoelectric layer.

71. A piezoelectric transducer according to claim 67 wherein said first electroconductive layer is disposed between said semiconductor substrate and said first polarized piezoelectric layer.

72. A process of forming a piezoelectric transducer on a semiconductor substrate, comprising the steps of:
(a) forming a first electroconductive layer over at least a portion of a first surface of said semiconductor substrate;
(b) forming a layer comprising a copolymer of vinylidene fluoride and trifluoroethylene over the first electroconductive layer; and
(c) applying an electrical field across said semiconductor substrate and said copolymer layer to polarize said copolymer layer.

73. A process according to claim 72 wherein the copolymer layer of step (a) is spin coated or solution cast over the first electroconductive layer.

74. A process according to claim 72 wherein a corona discharge is used to polarize said copolymer layer in step (c).

75. A process according to claim 72 wherein a second electroconductive layer is applied over the exposed surface of said copolymer layer and said copolymer layer is poled directly in step (c).

76. A process according to claim 72 wherein a film having a resistivity approximately equal to the resistivity of said copolymer layer is applied over the copolymer layer and the copolymer layer is press poled in step (c).

77. A process according to claim 76 wherein the film is removed from the copolymer layer after poling.

78. A process according to claim 77 wherein the film comprises unpolarized vinylidene fluoride-trifluoroethylene copolymer.

79. A process according to claim 78 wherein a plurality of vinylidene fluoride-trifluoroethylene copolymer films are stacked on the copolymer layer.

80. A process according to claim 72 wherein said first electroconductive layer is patterned to have at least two electrically unconnected regions.

81. A process according to claim 80, further comprising the steps of:
forming through-holes in said semiconductor substrate to make electrical connections with the electrically unconnected regions of said first electroconductive layer.

82. A process according to claim 72 wherein said first electroconductive layer is disposed over substantially all of said first surface of the semiconductor substrate.

83. A process according to claim 72 wherein said semiconductor substrate is doped silicon.

84. A process according to claim 72 wherein said copolymer comprises from about 60 to about 95 mole percent vinylidene fluoride and from about 5 to about 40 mole percent trifluoroethylene.

85. A product produced by the process of claim 80.

* * * * *